United States Patent
Lipscomb et al.

(10) Patent No.: US 6,985,819 B2
(45) Date of Patent: Jan. 10, 2006

(54) DMM MODULE FOR PORTABLE ELECTRONIC DEVICE

(75) Inventors: Edward E. Lipscomb, Lakeville, MN (US); Kurt Raichle, Owantonna, MN (US); Troy Liebl, Owatonna, MN (US); Scott R. Sebastian, Three Rivers, MI (US); Martin P. Franz, Portage, MI (US)

(73) Assignee: SPX Corporation, Charlotte, NC (US)

( * ) Notice: Subject to any disclaimer, the term of this patent is extended or adjusted under 35 U.S.C. 154(b) by 215 days.

(21) Appl. No.: 10/022,571

(22) Filed: Dec. 20, 2001

(65) Prior Publication Data

US 2003/0034769 A1    Feb. 20, 2003

Related U.S. Application Data

(60) Provisional application No. 60/312,477, filed on Aug. 15, 2001.

(51) Int. Cl.
    *G01R 23/16*    (2006.01)

(52) U.S. Cl. .................. 702/57; 702/68; 324/76.11; 324/115

(58) Field of Classification Search .............. 702/57, 702/64–68, 70; 324/76.11, 76.12, 76.15, 324/115, 111, 121 R, 375
See application file for complete search history.

(56) References Cited

U.S. PATENT DOCUMENTS

| | | | |
|---|---|---|---|
| 4,034,291 A * | 7/1977 | Allen et al. ............. 324/121 R |
| 4,864,512 A * | 9/1989 | Coulson et al. ............... 702/67 |
| 5,142,221 A * | 8/1992 | Meldrum et al. ............ 324/115 |
| 5,202,682 A * | 4/1993 | Finger .................... 340/870.19 |
| 5,250,893 A * | 10/1993 | Gambill et al. ............. 324/115 |
| 5,530,373 A * | 6/1996 | Gibson et al. .............. 324/758 |
| 5,877,431 A * | 3/1999 | Hirano .................... 73/862.41 |
| 5,923,161 A * | 7/1999 | Frankovitch et al. ....... 324/115 |
| 5,963,889 A * | 10/1999 | Irregger et al. ............. 702/124 |
| 6,068,400 A * | 5/2000 | Nelson et al. .............. 374/179 |
| 6,140,811 A * | 10/2000 | Little ......................... 324/115 |
| D435,796 S * | 1/2001 | Tomiyama et al. .......... D10/78 |
| 6,218,824 B1 * | 4/2001 | Oldstead et al. ............ 324/115 |
| 6,392,402 B1 * | 5/2002 | Swift ......................... 324/132 |
| 6,449,741 B1 * | 9/2002 | Organ et al. ................ 714/724 |
| 6,622,109 B2 * | 9/2003 | Ermer et al. ................ 702/145 |
| 6,777,945 B2 * | 8/2004 | Roberts et al. ............. 324/426 |
| 2003/0034767 A1 * | 2/2003 | Lipscomb et al. ....... 324/76.12 |
| 2003/0040883 A1 * | 2/2003 | Ermer et al. ................ 702/145 |
| 2003/0122548 A1 * | 7/2003 | Raichle et al. ............. 324/401 |
| 2004/0054503 A1 * | 3/2004 | Namaky ..................... 702/183 |
| 2005/0009561 A1 * | 1/2005 | Hollstrom et al. ........ 455/556.1 |
| 2005/0097191 A1 * | 5/2005 | Yamaki et al. ............. 709/219 |

\* cited by examiner

*Primary Examiner*—Carol S. W. Tsai
(74) *Attorney, Agent, or Firm*—Baker & Hostetler LLP

(57) ABSTRACT

A digital multimeter adapter for a portable electronic device includes a hardware interface connector and a computer program memory. The memory stores computer program instructions that direct the electronic device to collect data representative of a signal from an external source, analyzing the data to identify a characteristic such as voltage, current, or resistance, and displaying the data in digital format. The user may select one or more of the scales of the display. The adapter also may include a model value database, a collected value database, an application-specific database, and/or a language database.

21 Claims, 6 Drawing Sheets

DMM MODULE FOR PORTABLE ELECTRONIC DEVICE

This application claims the benefit of Provisional application Ser. No. 60/312,477, filed Aug. 15, 2001.

FIELD OF THE INVENTION

The present invention relates generally to digital multimeters (DMMs). More particularly, the present invention relates to an adapter device, such as a plug-in module, that allows a portable electronic device to function as a DMM.

BACKGROUND OF THE INVENTION

A DMM is an electronic device used to display and/or analyze electronic signal measurements in digital numeric and/or graphic form. In its simplest form, a DMM provides an electronic representation of instantaneous signal voltage, current, and/or resistance. Optionally, a DMM may display its readings as a bar graph or in some other form that provides a visual representation of magnitude.

Figure 1:
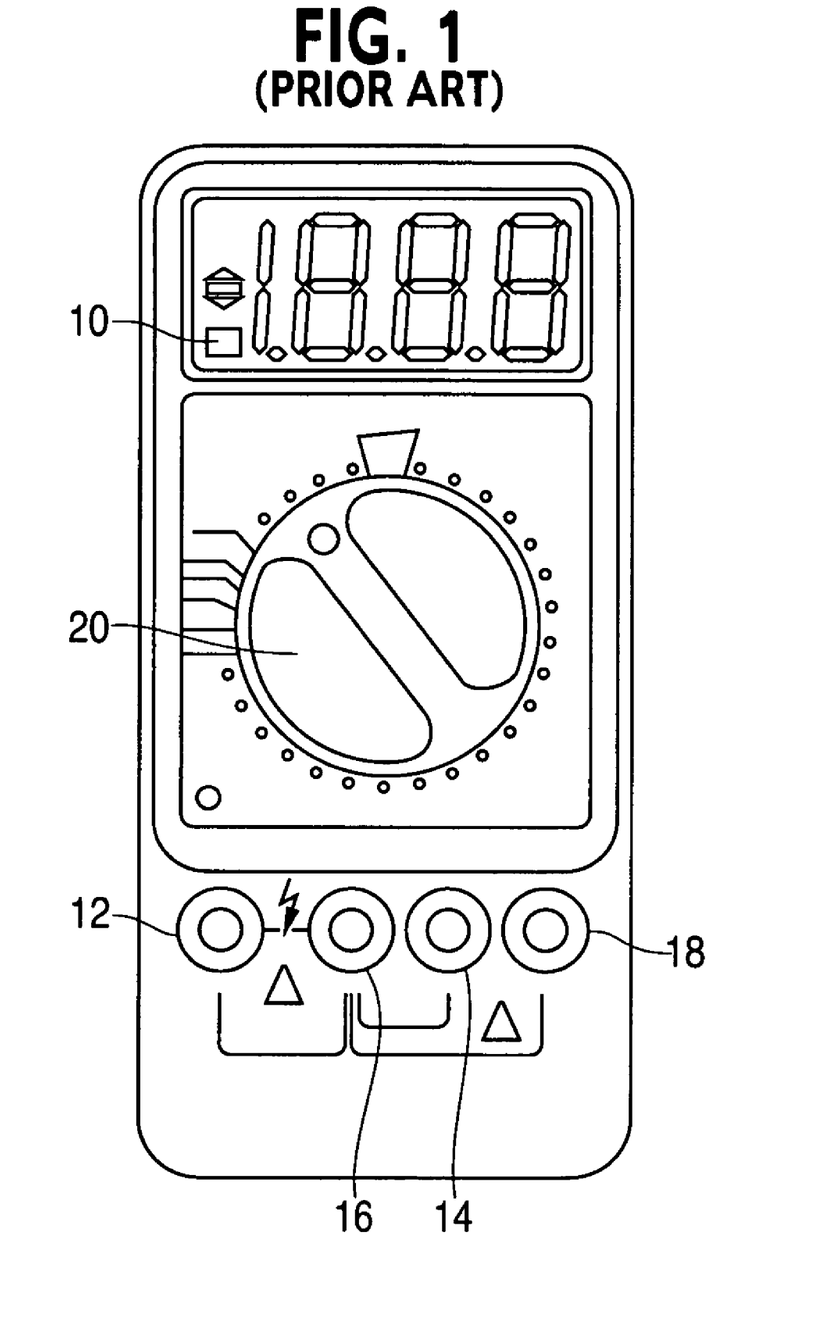
FIG. 1 illustrates a prior art DMM.

A typical prior art digital multimeter is illustrated in FIG. 1. Referring to FIG. 1, the DMM includes a digital display 10 on which numeric values of signal readings are displayed. Wire probes or leads are connected to the DMM through various input terminals. A typical DMM includes a voltage and resistance input terminal 12 that is used to read signal voltage and/or wire resistance, a current or amperage input terminal 14 that is used for current measurements, and a common terminal 16 that is used for both voltage/resistance and current measurements. Often, two current input terminals are provided so that a first current input terminal 14 is available for small current measurements and a second current input terminal 18 is available for large current measurements. To measure a signal voltage, current, or a resistance, the user places leads in the common terminal 16 and either the voltage/resistance terminal 12 or one of the current terminals 14 and 18. The two leads are then placed across the item for which the measurement is desired and the measurement is displayed on the display 10. A function/range switch 20 is also typically provided to allow the user to choose the measurement to be displayed, (i.e., voltage, resistance, or current) and select a range of units for the display.

Although prior DMMs are typically hand-held devices, prior DMMs have been limited to stand-alone units. In areas with limited space such as service garages, it is desirable to have a portable and small device that can serve multiple functions. In addition, users who move from place to place find it undesirable to carry, store, transport, and care for multiple electronic devices. While the prior art has taught that a DMM may be provided with other functionality, such as that of an oscilloscope as described in U.S. Pat. No. 4,034,291, to Allen et al., to date general electronic devices have not been provided with add-on DMM functionality.

Accordingly, it is desirable to provide an improved adapter device that enables a portable electronic device to function as a DMM.

SUMMARY OF THE INVENTION

It is therefore a feature and advantage of the present invention to provide an improved adapter device that enables a portable electronic device to function as a DMM.

The above and other features and advantages are achieved through the use of a novel adapter for a portable electronic device as herein disclosed. A digital multimeter adapter for a portable electronic device includes a hardware interface connector and a computer program memory. The memory stores computer program instructions that direct the electronic device to collect data representative of a signal from an external source, analyzing the data to identify a characteristic such as voltage, current, or resistance, and displaying the date in digital format. The user may select one or more of the scales of the display. The adapter also may include a model value database, a collected value database, an application-specific database, and/or a language database.

In accordance with one embodiment of the present invention, a digital multimeter adapter for a portable electronic device includes a module adapted to interface with a hardware interface port of a portable electronic device having a processor and a display. The module includes a computer program memory. The memory stores computer program instructions thereon to direct the processor to perform the steps of: (1) collecting data representative of an electrical signal from an external source; and (2) displaying the data on the display in a digital format representing a characteristic of the signal. Optionally, the characteristic comprises voltage, current, or resistance.

Optionally, the adapter further includes a database of model signal values, and the instructions further direct the processor to display a model signal value from the database on the display.

Optionally, the adapter further includes a database of collected signal value data, and the instructions further direct the processor to store the data representative of the signal in the database of collected signal value data.

Optionally, the adapter or the electronic device contains a buffer, and the instructions further direct the processor to store the data representative of the signal in the buffer.

Optionally, the instructions further direct the processor to provide an electronic device that, when activated by a user, allows the user to adjust the characteristics to be displayed on the display. In such an embodiment, preferably the electronic device input that allows the user to adjust the characteristic is displayed on a setup screen.

Optionally, the adapter further includes a language database containing data representative of words in a plurality of languages.

An alternate embodiment provides a method of causing an electronic device to function as a digital multimeter. The method includes the steps of: (1) connecting an adapter module to a hardware interface port of a portable electronic device having a processor, a display, and a memory; (2) delivering computer program instructions from the module to a processor for the electronic device; (3) collecting, using a plurality of leads connected to the electronic device, data representative of a signal from an external source; (4) analyzing, using a processor of the electric device, the data to identify a characteristic of the signal; and (5) displaying, in response to the computer program instructions, the characteristics in digital format.

Optionally, the method adapter further includes a database of model values, and the method further includes selecting a model value from the database and displaying the selected model value on the display.

Optionally, the adapter further includes a database of collected characteristics values, and the method further includes storing the characteristics identified in the analyzing step in the database of collected characteristic values.

Optionally, the adapter or the electronic device contains a buffer, and the method further includes storing the characteristics identified in the analyzing step in the buffer.

Optionally, the method includes the additional step of selecting the characteristic from a set of characteristics including voltage, current, and resistance. Preferably, this selecting step is performed while a setup screen is displayed on the display.

Optionally, the adapter further includes a language database containing data representative of words in a plurality of languages, and the method comprises the additional steps of translating text and displaying the translated text on the display.

There have thus been outlined the more important features of the invention in order that the detailed description thereof that follows may be better understood, and in order that the present contribution to the art may be better appreciated. There are, of course, additional features of the invention that will be described below and which will form at least part of the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract included below, are for the purpose of description and should not be regarded as limiting in any way.

As such, those skilled in the art will appreciate that the concept and objectives, upon which this disclosure is based, may be readily utilized as a basis for the design of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

A preferred embodiment of the present invention comprises an improved adapter device that provides processing, storage, and/or program instructions for enabling a portable electronic device to function as a DMM. Preferably, the device is an add-on adapter, such as a plug-in module, that serves as an add-on DMM for a portable, and preferably hand-held, electronic device, such as a portable computer, pocket PC, personal digital assistant, analog or digital analyzer, electronic game, or other electronic device. The module includes a memory or other carrier storing program instructions for adding functionality to the electronic apparatus, or the module may include hardware to accept a computer memory containing computer program instructions and deliver such instructions to the electronic device and/or to add processing capability to the device.

Figure 2:
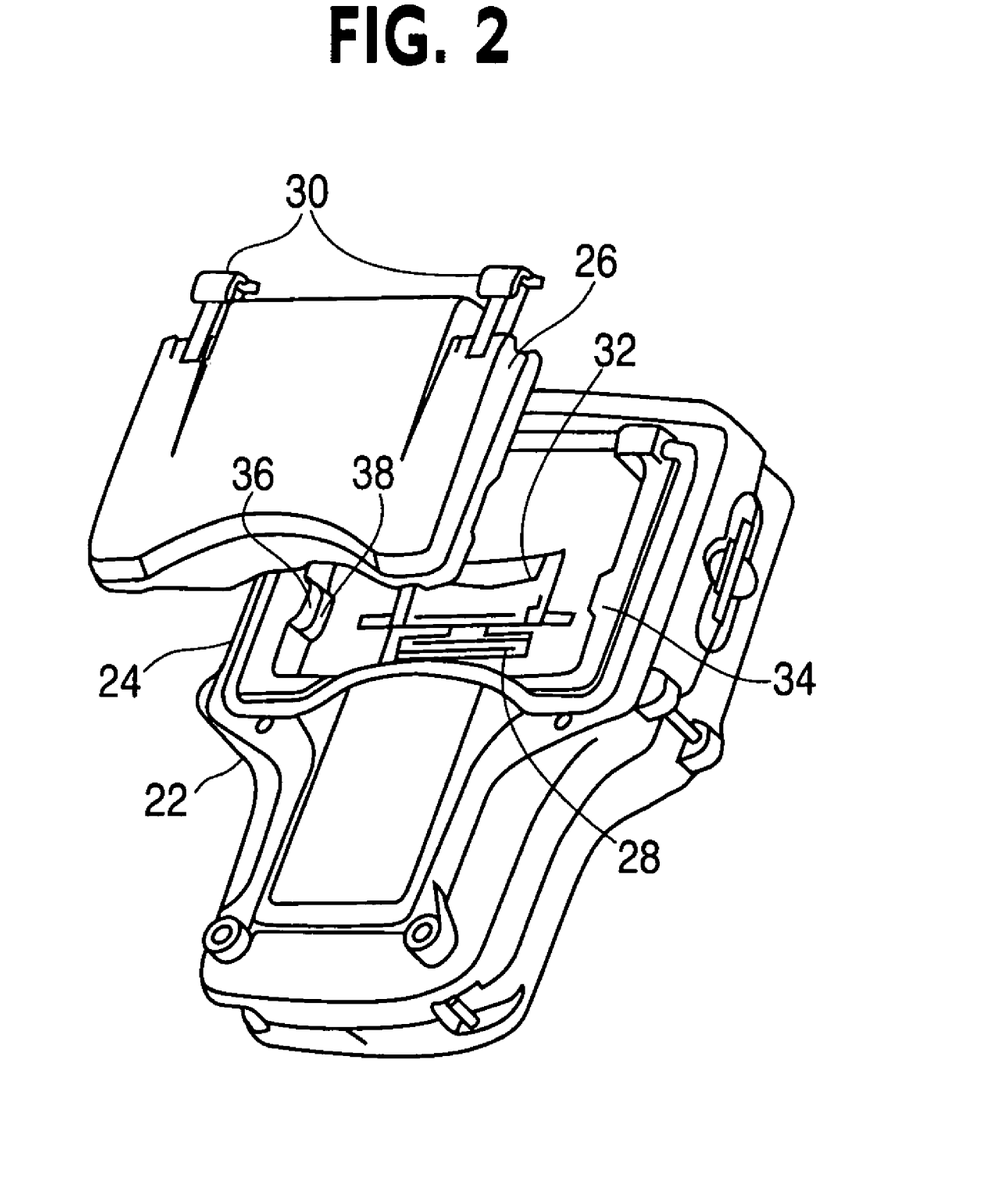
FIG. 2 illustrates an exemplary embodiment of a portable electronic device that can be used with the present inventive adapter.

FIG. 2 illustrates an exemplary embodiment of a portable electronic device that can be used with the present inventive adapter. Referring to FIG. 2, a portable electronic device 22 includes a module port 24 that may accept a module such as a plug-in module 26. At least one such electronic device is described on pages 6–8 and the accompanying drawings in co-pending U.S. patent application Ser. No. 09/702,450, entitled "Plug-In Module for Portable Computing Device," which is hereby incorporated herein by reference.

Returning to FIG. 3, the portable electronic device preferably includes a hardware interface port 28 such as a 120-pin or 120-receptacle connector to provide an interface between the plug-in module and the electronic device. The adapter module 26 mates with the hardware interface port 28 of the electronic device via a hardware interface connector that is included with the adapter module. The adapter module 26 and/or the device 22 preferably includes a means to secure the module 26 to the device 22. For example, FIG. 2 illustrates that one or more latches 30 may be provided to secure the module 26 to the electronic device 22 during normal operation.

The electronic device illustrated in FIG. 2 is a portable engine analyzer, such as that which may be used to measure and analyze various aspects of the operation of a vehicle. However, the electronic device may in fact be any type of analyzer or other type of portable electronic or computing device such as a pocket PC or a personal digital assistant, a remote control, an electronic game, or any other portable electronic device. In the embodiment of an engine analyzer, the analyzer may serve to collect and analyze multiple aspects of an engine or vehicle, including aspects of the vehicle operations such as emissions components, system pressure, fluid pressure, system temperature, and other aspects or conditions. However, the analyzer or other electronic device may be equipped with additional functionality.

Figure 3:
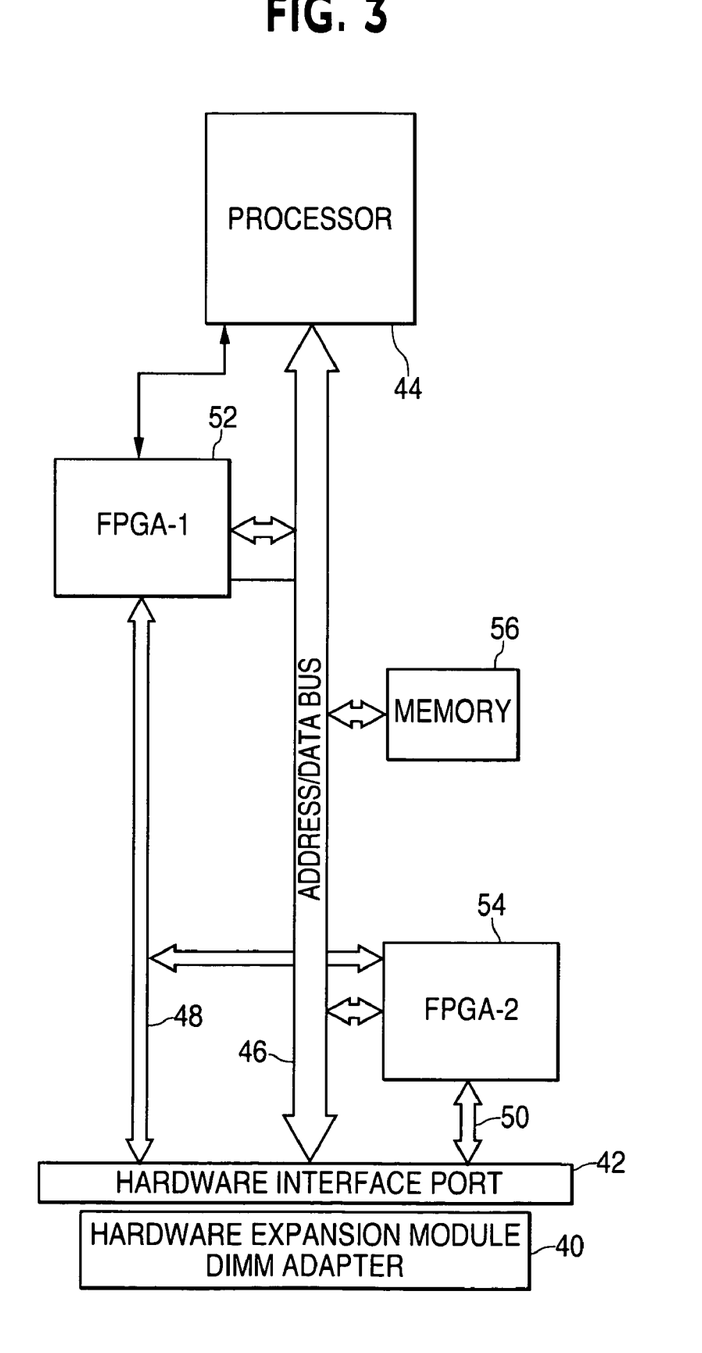
FIG. 3 is a block diagram illustrating the exemplary hardware of an electronic device with which the present inventive module may interface.

FIG. 3 illustrates the internal components of an exemplary electronic device. Such components may interface with the module through the hardware interface port. Referring to FIG. 3, a hardware interface connector of an exemplary DMM adapter module 40 interfaces with a hardware interface port 42. Certain pins or receptacles on the hardware interface port 42 provide communication to and from a controller 44 via interface bus 46 within the portable electronic device. The hardware interface port 42 may also serve to communicate discrete input/output signals via interface bus 46 to the DMM module through the hardware interface connectors 40, and the DMM module may share input/output signals 48 and/or 50 with one or more field programmable gate array (FPGA) components within the electronic device such as 52 and/or 54. The device may also include a memory or buffer 56 that stores data collected by the device.

To provide a DMM adapter module for an electronic device, the module may include a computer program memory or other carrier, such as a floppy disc, a CD-ROM, a virtual memory, or a signal, containing computer program instructions that instruct the electronic apparatus to perform such functions. These instructions are preferably loaded into the electronic device when the DMM application is selected. Optionally, the module may also provide processing hardware that can be used by the electronic device when performing such functions. Preferably, the module includes a custom-programmed FPGA or other circuitry to provide some or all processing functions, such as timing, sampling, and/or analog-to-digital converter functions. Such memory, circuitry, and/or processing hardware may be included in the module itself, or optionally the module may simply contain communications hardware that provides an interface between the hardware interface port of the portable electronic device and an external memory or processor.

Program instructions contained in the module instruct the display of the electronic device to display DMM functions, such as digital alternating current (AC) and/or pulsating direct current (DC) readings, voltage readings, and resistance readings. Optionally, such readings may be displayed in numeric and/or graphic format, such as with a bar graph.

Figure 4A:
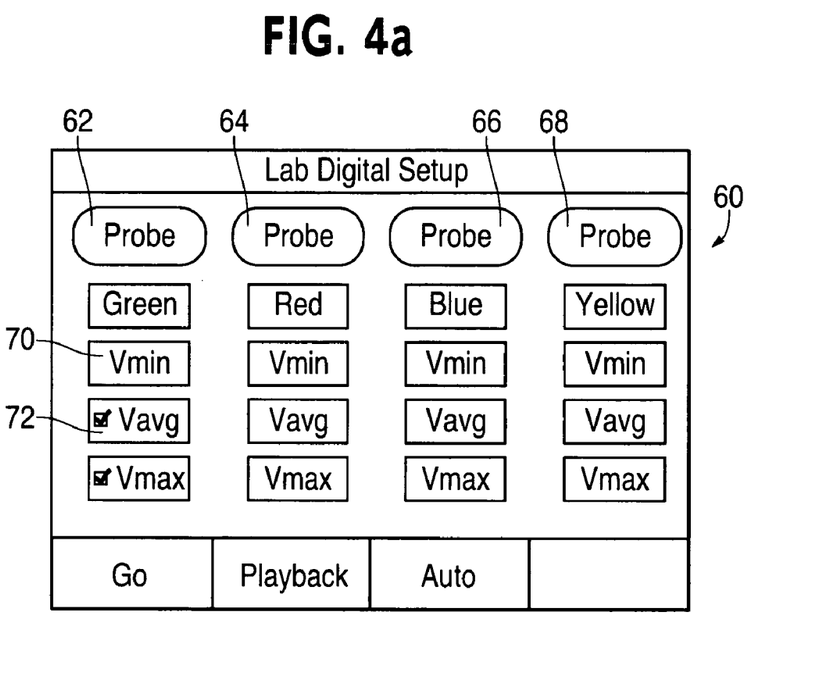
FIGS. 4a and 4b illustrate exemplary display screens in which the adapter module provides for setup and display of input signals.
Figure 4B:
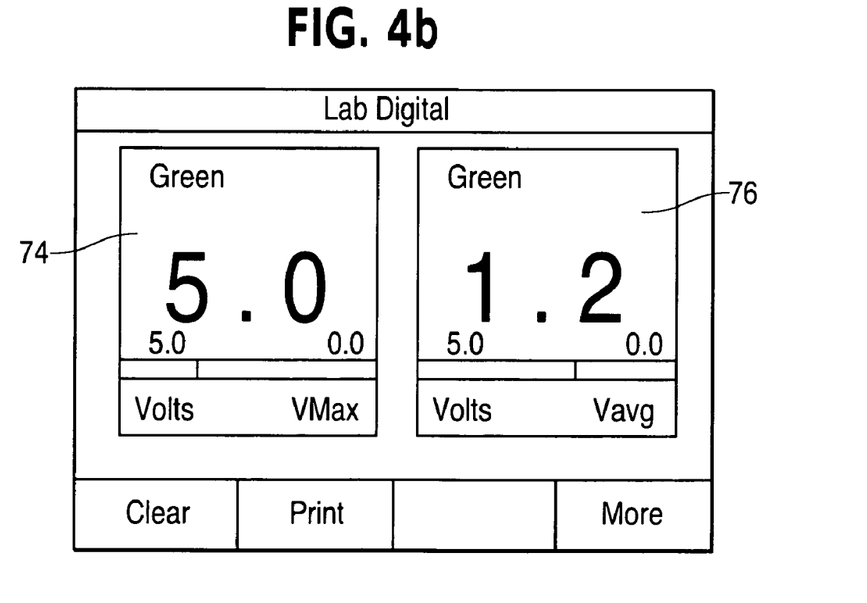

FIG. 4a illustrates an exemplary embodiment of a setup screen 60 that may appear on the display of an electronic device when used with the present inventive DMM adapter module. As illustrated in FIG. 4a, the electronic device will be equipped with at least four inputs to which leads or probes are connected. These inputs will collect data from the thing to be analyzed, such as an automobile engine, and deliver the data to the electronic device and/or the adapter module through corresponding input channels. These channels are identified on display screen 60 as 62, 64, 66, and 68 and are preferably color-coded, although the colors identified in FIG. 4a are only intended as exemplary, and in fact any combination of colors may be used. For a DMM adapter module, the channels preferably correspond to typical DMM inputs such as a voltage/resistance input, two current inputs, and a common input. Data collected by each input as analog signals are converted, using analog-to-digital conversion circuitry located in either the electronic device or the adapter, to a digital format and displayed in digital format on the display of the electronic device as illustrated in FIG. 4b. The measurements displayed may include one or more of the following functions: direct current, alternating current, ohms, frequency, duty cycle, rotations per minute, dwell, dwell per cylinder, average dwell, amps, diode pattern, temperature, and vacuum. Other parameters, as well as varying ranges of the parameters, may also be displayed.

As illustrated in FIG. 4b, an optional and preferable setup function allows the user to select the scale and/or the type of measurement associated with each probe through an input such as a pushbutton, including those such as 70 and 72 or some other input such as a knob, a sliding scale, a keypad, or a numeric selector. Preferably, pre-set DMM configurations are provided, such as pre-set scales, to make setup simpler.

FIG. 4b illustrates that multiple input signals, as well as multiple scales or aspects of a single signal, may be displayed on a single screen. For example, the maximum value 74 and an average value 76 may be displayed at the same time. The displayed parameters may be of "live" signals, based on real-time collection of data, or one or both of the values may be based on data previously collected and stored in the memory unit of the adapter module. For example, the adapter module may be programmed to include a database of previously collected signal data and/or data representative of predetermined conditions (such as optimal values), and the user may compare a real-time readings with one or more of the stored values to help diagnose problems or other circumstances relating to the item that is being analyzed. An optional manual mode may allow the user to set up the DMM for sensors and signals that are not contained in the database.

Figure 5:
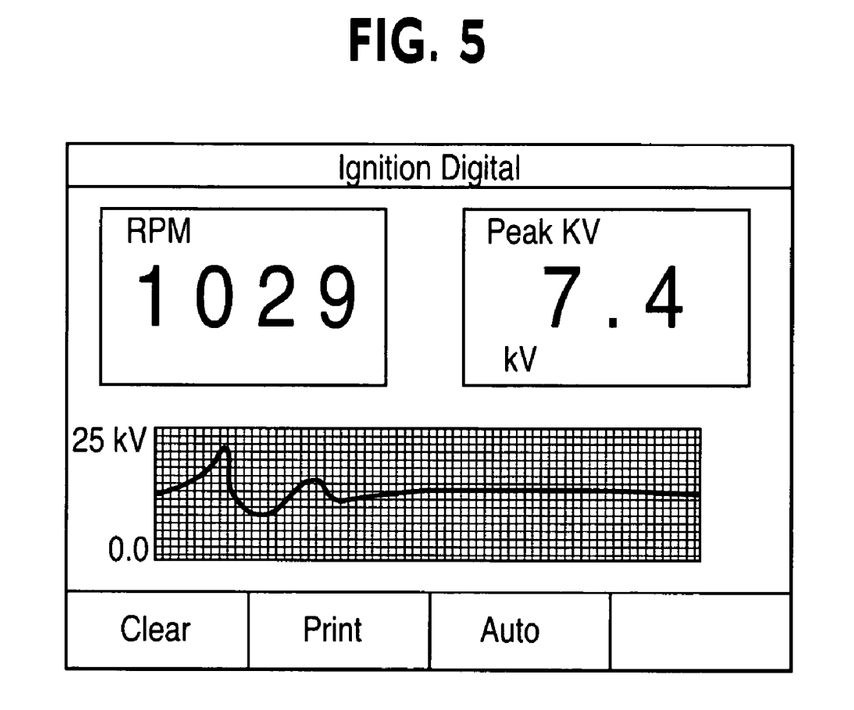
FIG. 5 illustrates an embodiment where the adapter module provides both oscilloscope and DMM functionality.

Optionally, other functions provided by the adapter may be displayed, either by themselves or along with the waveform. For example, as illustrated in FIG. 5, in an embodiment where the adapter module provides both oscilloscope and DMM functionality, the screen may display input signals in both DMM 80 and oscilloscope 82 format.

Depending on the design of the electronic device, the user inputs, such as scale selection, may be performed through buttons, knobs, or other inputs located on the electronic device. Alternatively, in the case where the device is equipped with a touch-sensitive screen, such as with a personal digital assistant, the inputs may be performed by touching an appropriate area of the screen. For example, referring to FIG. 4a, one or more touch—sensitive buttons such as 70 and 72 may be included, and the user may adjust the scale or select the reading by touching the buttons on the screen.

Optionally and preferably, the adapter module is programmed to provide glitch detection, i.e., the ability to detect abnormalities in the signal and alert the user that such abnormalities have been detected.

Preferably, the displays will employ a user interface engine that allows graphs, charts, titles, and/or numeric quantities to be displayed in one or more panels. The engine will preferably use compiled structures of data, items, and their screen locations to display the appropriate components on a given screen. Such compiled structures may include information such as the source of the data, the information required by the DMM driver to capture the data, the method of displaying it (such as line, bar chart, or digital reading), the function needed to convert a raw analog-to-digital converter reading into appropriate units for display (preferably including exception handling for domain and range errors), and such phrase keys as may be required for units, labels, and instructions. The panels may further employ cursors, digital measurements, text labels and/or other features. Display screens will preferably comprise one or more of the panels. When invoked, the user interface engine will arrange the panels on the display screen in one of several predetermined formats, such as tiling the components in a series of windows.

When used in connection with a portable electronic engine analyzer, the module and analyzer may be used to diagnose problems with vehicle systems such as automotive engines. In an apparatus of this type, the analyzer, or optionally the module, includes several leads or test probes that a mechanic or other technician may attach to various components of a vehicle. The analyzer will use these probes to gather various types of information while the mechanic or technician performs certain actions such as maintaining the engine under load or starting the engine. The results of such tests, and knowledge about the vehicle or engine type, trouble symptoms, allowable limits, and other data, can lead to a diagnosis of a problem. Diagnosis usually points to some corrective action such as the replacement of parts or the performance of system adjustments by the mechanic.

Preferably, the mechanic may use the module and analyzer in accordance with at least three modes: (1) a data capture mode, which provides for collection of measurements or other data by the analyzer; (2) a display mode, which allows the user to visualize the data in one of several formats such as a numeric reading; and (3) optional recording and/or sharing modes that allow the user to record and/or share events of interest with the vehicle's owner, other mechanics, or others. Such recording may take place in the adapter module's storage unit, or the analyzer and/or module may deliver the data to a remote location, whether by a direct connection, a wireless connection, or a network such as the Internet or an intranet, for storage. The DMM adapter module provides the electronic device with the display mode capability, and it may optionally also provide or enhance the data capture functions of the electronic device.

Figure 6:
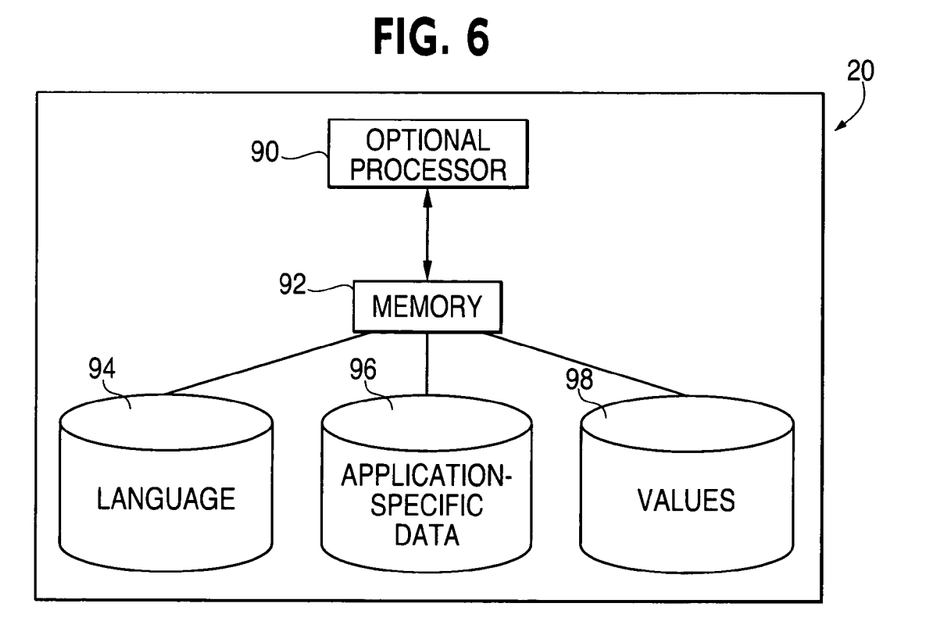
FIG. 6 is a block diagram that illustrates several hardware and software features of the an exemplary adapter module.

As noted above, and as illustrated in FIG. 6, the adapter module contains a carrier such as a computer memory 90 that stores computer program instructions. The program instructions direct the electronic device to operate as an DMM. Optionally, the program instructions may be used to direct the operation of an optional processor 92 contained within the adapter module. Optionally, the adapter module memory also stores computer program instructions that direct the electronic device to provide other features, such as one or more printing device drivers, communications capability, software version updating features, calibration, and waveform storage. Preferably, the module memory also contains one or more databases such as language databases 94 that may be used to translate on-screen language to another language. In addition, for specific applications such as a vehicle engine analyzer, application-specific data 96 such as vehicle information (e.g., ignition and/or engine name, number of cylinders, ignition type, cylinder firing order, and/or cam/crank timing flag) may be provided. Databases of previously collected and/or model values 98 are also optionally and preferably included. When such a model value database 98 is included, the program instructions preferably include a capture buffer manager or other application to capture input signal information in a buffer such as a portion of the memory 90 for playback and/or storage. The capacity of the buffer may vary with the size of the memory provided with the adapter module.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, all of which may fall within the scope of the invention.

What is claimed is:

1. A digital multimeter adapter for a portable electronic device, comprising:
   a module adapted to interface with a hardware interface port of a portable electronic device having a processor and a display, the module including a computer program memory, the module being a separate device from a device being tested and the module configured to provide additional capability to a separate portable electronic device;
   the memory storing computer program instructions thereon to direct the processor to perform the steps of:
   collecting data representative of an electrical signal from a device being tested; and
   displaying the data on the display in a digital format representing a characteristic of the signal.

2. The adapter of claim 1 wherein the characteristic comprises voltage, current, or resistance.

3. The adapter of claim 1 wherein the adapter further includes a database of model signal values, and the instructions further direct the processor to display a model signal value from the database on the display.

4. The adapter of claim 1 wherein the adapter further includes a database of collected signal value data, and the instructions further direct the processor to store the data representative of the signal in the database of collected signal value data.

5. The adapter of claim 1 wherein the adapter or the electronic device contains a buffer, and the instructions further direct the processor to store the data representative of the signal in the buffer.

6. The adapter of claim 1 wherein the instructions further direct the processor to provide an electronic device input that, when activated by a user, allows the user to adjust the characteristic to be displayed on the display.

7. The adapter of claim 1 wherein the adapter further includes a language database containing data representative of words in a plurality of languages.

8. A method of causing an electronic device to function as a digital multimeter, comprising:
   connecting an adapter module to a hardware interface port of a portable electronic device having a processor, a display, and a memory;
   changing the function of the electronic device with the module to have the electronic device perform as a digital multimeter;
   delivering computer program instructions from the module to the processor for the electronic device;
   collecting, using a plurality of leads connected to the electronic device, data representative of a signal from an external source separate from the module;
   analyzing, using a processor of the electronic device, the data to identify a characteristic of the signal; and
   displaying, in response to the computer program instructions, the characteristic in digital format.

9. The method of claim 8 wherein the adapter further includes a database of model values, and the method further includes selecting a model value from the database and displaying the selected model value on the display.

10. The method of claim 8 wherein the adapter further includes a database of collected characteristic values, and the method further includes storing the characteristic identified in the analyzing step in the database of collected characteristic values.

11. The method of claim 8 wherein the adapter or the electronic device contains a buffer, and the method further includes storing the characteristic identified in the analyzing step in the buffer.

12. The method of claim 8 comprising the additional step of selecting the characteristic from a set of characteristics including voltage, current, and resistance.

13. The method of claim 12 wherein the selecting step is performed while a setup screen is displayed on the display.

14. The method of claim 8 wherein the adapter further includes a language database containing data representative of words in a plurality of languages, and the method comprises the additional steps of translating text and displaying the translated text on the display.

15. A plug-in module for a portable electronic device, comprising:
   a means for interfacing with an electronic device; and
   a computer program memory, the memory storing computer program instructions thereon to direct a processor to perform the steps of:
   collecting data representative of an signal from an external source separate and independent from the module;
   analyzing the data to identify a characteristic of the signal; and
   displaying the characteristic on a display of the electronic device in digital format.

16. The module of claim 15 wherein the module further includes a database of model values.

17. The module of claim 16 wherein the instructions further direct the processor to display a model value from the database on the display.

18. The module of claim 15 wherein the module further includes a database of collected characteristic values.

19. The module of claim 18 wherein the instructions further direct the processor to store the characteristic identified in the analyzing step in the database of collected waveform data.

20. The module of claim 15 wherein the module further includes a language database containing data representative of words in a plurality of languages.

21. The adapter of claim 5 wherein the electronic device input that allows the user to adjust the characteristic is displayed on a setup screen.

* * * * *